US012765293B2

(12) United States Patent
Chiu et al.

(10) Patent No.: US 12,765,293 B2
(45) Date of Patent: Oct. 13, 2026

(54) SEMICONDUCTOR DEVICE AND MANUFACTURING METHOD THEREOF

(71) Applicant: National Tsing Hua University, Hsinchu City (TW)

(72) Inventors: Po-Wen Chiu, Hsinchu City (TW); Yu-Lun Yang, Hsinchu City (TW)

(73) Assignee: National Tsing Hua University, Hsinchu City (TW)

( * ) Notice: Subject to any disclaimer, the term of this patent is extended or adjusted under 35 U.S.C. 154(b) by 191 days.

(21) Appl. No.: 18/943,795

(22) Filed: Nov. 11, 2024

(65) Prior Publication Data

US 2026/0052922 A1 Feb. 19, 2026

(30) Foreign Application Priority Data

Aug. 13, 2024 (TW) ................................ 113130359

(51) Int. Cl.

| | |
|---|---|
| ***H10P 50/28*** | (2026.01) |
| ***H10D 30/01*** | (2025.01) |
| ***H10D 30/47*** | (2025.01) |
| ***H10D 30/67*** | (2025.01) |
| ***H10D 62/80*** | (2025.01) |
| ***H10P 14/20*** | (2026.01) |
| ***H10P 14/60*** | (2026.01) |
| ***H10P 50/00*** | (2026.01) |

(52) U.S. Cl.

CPC ............. *H10P 50/28* (2026.01); *H10D 30/01* (2025.01); *H10D 30/47* (2025.01); *H10D 30/481* (2025.01); *H10D 30/675* (2025.01); *H10D 62/881* (2025.01); *H10D 62/882* (2025.01); *H10D 62/883* (2025.01); *H10P 14/3451* (2026.01); *H10P 14/6334* (2026.01); *H10P 50/00* (2026.01); *H10P 50/69* (2026.01); *H10P 50/695* (2026.01); *H10P 50/71* (2026.01); *H10P 50/73* (2026.01)

(58) Field of Classification Search

None

See application file for complete search history.

(56) References Cited

FOREIGN PATENT DOCUMENTS

| | | |
|---|---|---|
| CN | 108281357 | 7/2018 |
| CN | 114284352 | 4/2022 |
| CN | 116314260 | 6/2023 |

OTHER PUBLICATIONS

L. Kong et al., “Wafer-scale and universal van der Waals metal semiconductor contact”, Nature Communications, vol. 14, paper# 1014. (Year: 2023).*

(Continued)

*Primary Examiner* — Jiong-Ping Lu

(74) *Attorney, Agent, or Firm* — JCIPRNET

(57) ABSTRACT

A manufacturing method of a semiconductor device includes forming a van der Waals structure between a metal and a semiconductor. The method further includes: depositing a protective layer on a two-dimensional semiconductor layer, then patterning the protective layer and the two-dimensional semiconductor layer, forming a first electrode and a second electrode on the protective layer, and removing the protective layer completely, thereby forming a van der Waals contact structure between the first electrode and the semiconductor layer and between the second electrode and the semiconductor layer.

10 Claims, 13 Drawing Sheets

(56) References Cited

OTHER PUBLICATIONS

J. Jang et al., "Clean Interface Contact Using a ZnO Interlayer for Low-ContactResistance MoS2 Transistors", ACS Appl. Mater. Interfaces, vol. 12, pp. 5031-5039. (Year: 2020).*
Yuan Liu et al., "Approaching the Schottky—Mott limit in van der Waals metal—semiconductor junctions". Nature, vol. 557, No. 7707, May 31, 2018, pp. 696-712.
Jiahao Kang et al., "Computational Study of Metal Contacts to Monolayer Transition-Metal Dichalcogenide Semiconductors", Physical Review X, vol. 4, No. 3, Jul. 14, 2014, pp. 1-14.
Seunghyun Lee et al., "Statistical Study on the Schottky Barrier Reduction of Tunneling Contacts to CVD Synthesized MOS2", Nano Letters, vol. 16, No. 1, Dec. 23, 2015, pp. 276-281.
Chao-Hui Yeh et al., "Graphene—Transition Metal Dichalcogenide Heterojunctions for Scalable and Low-Power Complementary Integrated Circuits", ACS Nano, vol. 14, No. 1, Jan. 6, 2020, pp. 985-992.
Pin-Chun Shen et al., "Ultralow contact resistance between semimetal and monolayer semiconductors", Nature, vol. 593, No. 7858, May 13, 2021, pp. 211-231.
Gihyeon Kwon et al., "Interaction- and defect-free van der Waals contacts between metals and two-dimensional semiconductors", Nature Electronics, vol. 5, Apr. 2022, pp. 241-247.
Yan Wang et al., "Van der Waals contacts between three-dimensional metals and two-dimensional semiconductors", Nature, vol. 568, No. 7750, pp. 70-82. (year 2019).

* cited by examiner

SEMICONDUCTOR DEVICE AND MANUFACTURING METHOD THEREOF

CROSS-REFERENCE TO RELATED APPLICATION

This application claims the priority benefit of Taiwan application serial no. 113130359, filed on Aug. 13, 2024. The entirety of the above-mentioned patent application is hereby incorporated by reference herein and made a part of this specification.

BACKGROUND OF THE INVENTION

Field of the Invention

The invention pertains to a manufacturing method for a semiconductor device, specifically focusing on forming a van der Waals structure between a metal and a semiconductor.

Description of Related Art

Two-dimensional (2D) materials refer to materials with a layered structure, characterized by weak interlayer van der Waals interactions without covalent bonds between layers. Due to the absence of dangling bonds on the lattice surface, these materials exhibit minimal carrier mobility degradation even at reduced channel thicknesses, offering superior gate control capabilities at the nanometer scale compared to silicon-based fin field-effect transistors (FinFETs). Consequently, 2D materials hold significant potential as channel materials for next-generation semiconductor logic devices.

However, the manufacturing processes and methods of most transistors made of two-dimensional materials do not comply with silicon-based manufacturing processes, and there are no better solutions to issues such as mass production and yield improvement.

SUMMARY OF THE INVENTION

The present invention provides a method for manufacturing a semiconductor device, which includes forming a van der Waals contact structure between a metal electrode and a two-dimensional semiconductor layer, thereby improving yield and enabling integration with silicon-based manufacturing processes suitable for mass production.

A manufacturing method of a semiconductor device of the invention includes depositing a protective layer on a two-dimensional semiconductor layer, then patterning the protective layer and the two-dimensional semiconductor layer, forming a first electrode and a second electrode on the protective layer, and removing the protective layer completely, thereby forming a van der Waals contact structure between the first electrode and the two-dimensional semiconductor layer and between the second electrode and the two-dimensional semiconductor layer.

In an embodiment of the invention, a type of the protective layer includes a dielectric material such as oxide or nitride.

In an embodiment of the invention, a method of depositing the protective layer includes using a physical vapor deposition (PVD) or a chemical vapor deposition (CVD).

In an embodiment, patterning the protective layer and 2D semiconductor layer involves photolithography to create a mask on the protective layer, followed by etching to remove unprotected portions of both layers.

In an embodiment, the mask may consist of a patterned photoresist, oxide, nitride, metal, or a combination thereof.

In an embodiment of the invention, a method of forming the first electrode and the second electrode includes depositing a metal film on the protective layer, then removing a portion of the metal film via dry etching or wet etching.

In an embodiment of the invention, the metal film includes a single layer or several layers of a metal film formed by chemical vapor deposition or physical vapor deposition.

In an embodiment of the invention, forming the van der Waals contact structure includes removing the protective layer using isotropic etching or anisotropic etching method, so that the first electrode and the second electrode are collapsed onto the two-dimensional semiconductor layer.

In an embodiment of the invention, a method of removing the protective layer completely includes isotropic or anisotropic etching.

In an embodiment of the invention, a material of the two-dimensional semiconductor layer includes a tungsten disulfide ($WS_2$), molybdenum disulfide ($MoS_2$), tungsten diselenide ($WSe_2$), molybdenum ditelluride ($MoTe_2$), tungsten ditelluride ($WTe_2$), or molybdenum diselenide ($MoSe_2$) layered structure material.

In an embodiment of the invention, a method of forming the two-dimensional semiconductor layer on the substrate comprises: physical vapor deposition, chemical vapor deposition, or a transfer method.

In summary, the manufacturing process involves initially forming a protective layer on the 2D semiconductor layer, followed by defining the active area of the device through photolithography and etching, and then forming the electrodes. The protective layer effectively shields the 2D semiconductor layer during the fabrication steps, thereby improving yield. Subsequently, the protective layer is removed without damaging the 2D semiconductor, enabling the formation of a van der Waals contact structure that reduces contact resistance. This method allows the realization of high-yield semiconductor devices, such as transistors, 3DICs, and memory, compatible with existing silicon-based fabrication standards.

In order to make the aforementioned features and advantages of the disclosure more comprehensible, embodiments accompanied with figures are described in detail below.

BRIEF DESCRIPTION OF THE DRA WINGS

DESCRIPTION OF THE EMBODIMENTS

The following content provides several examples for implementing different features of the invention. However, the examples are only exemplary and are not intended to limit the scope and application of the invention. Furthermore, relative dimensions (such as length, spacing, etc.) and relative positions of various components or structures may be scaled up or down for clarity.

FIG. 1A to FIG. 1G illustrate cross-sectional schematics of a semiconductor device manufacturing process, according to an embodiment of the invention.

Figure 1A:
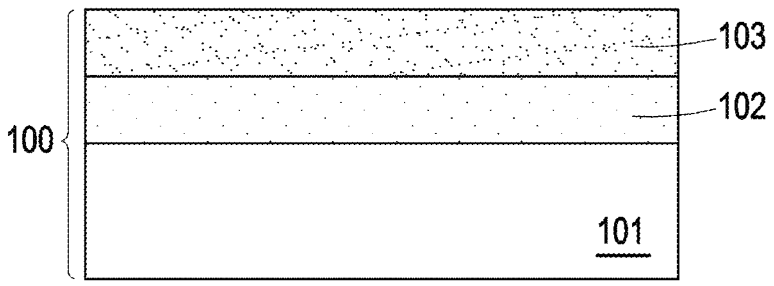
FIG. 1A to FIG. 1G are schematic cross-sectional diagrams of a manufacturing process of a semiconductor device according to an example of the invention.

In FIG. 1A, in the present embodiment, a substrate 100 includes monocrystalline, polycrystalline, or amorphous silicon or germanium which have a first dielectric material layer 102 and a second dielectric material layer 103.

In some embodiments, the substrate 100 is made of a compound semiconductor, such as silicon germanium (SiGe), gallium nitride (GaN), indium phosphide (InP), silicon carbide (SiC), gallium arsenide (GaAs), gallium oxide, an amorphous oxide semiconductor like InGaZnO, or a combination thereof. The substrate 100 may also include a single layer or several layers of an insulator, a metal, a semiconductor, a semiconductor on insulator (SOI), or a combination thereof.

Figure 1B:
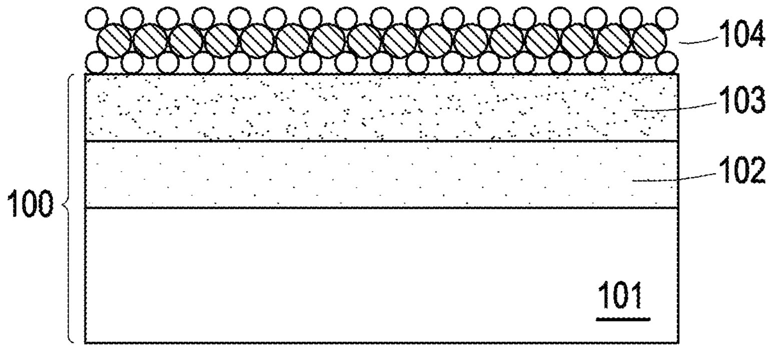

In FIG. 1B, a two-dimensional semiconductor layer 104 is formed on the substrate 100, wherein the material of the two-dimensional semiconductor layer 104 may be selected from the transition metal dichalcogenide family (TMDC), such as tungsten disulfide ($WS_2$), molybdenum disulfide ($MoS_2$), tungsten diselenide ($WSe_2$), etc., or compound semiconductor materials having a layered structure, such as $Bi_2O_2Se$, InSe, GaSe, etc. The layer is deposited by PVD, CVD, or transferred using a transfer method. The two-dimensional semiconductor layer 104 generally has an extremely small thickness and a relatively greater area.

Figure 1C:
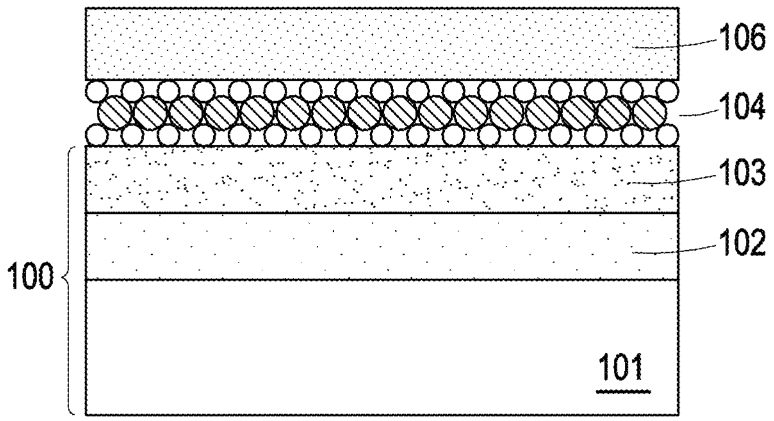

In FIG. 1C, a protective layer 106 is deposited on the two-dimensional semiconductor layer 104, wherein the material of the protective layer 106 may be selected from dielectric materials such as oxide or nitride, such as aluminum oxide ($Al_2O_3$), silicon oxide ($SiO_2$), aluminum nitride (AlN), silicon nitride ($Si_3N_4$), silicon oxynitride (SiON), or a combination of the above.

Figure 1D:
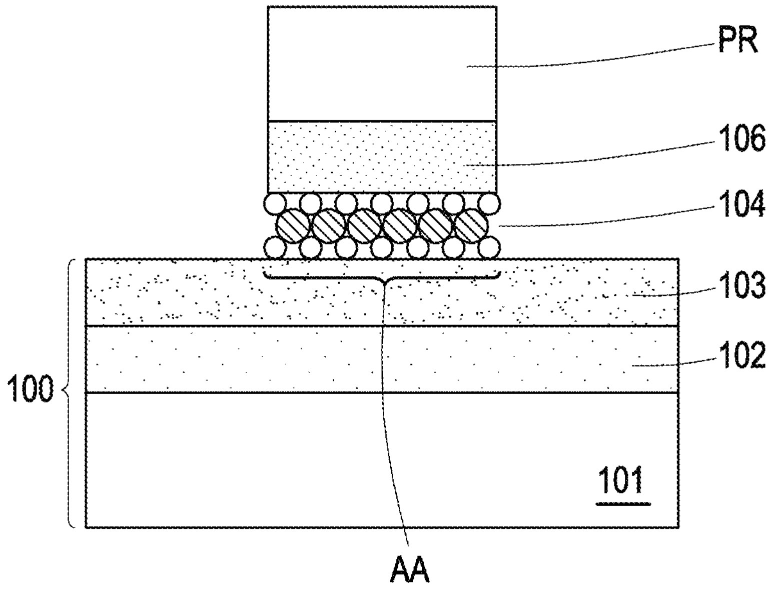

In FIG. 1D, the protective layer 106 and the two-dimensional semiconductor layer 104 are patterned to define an active area (AA) of the device. In the present embodiment, the method of patterning the protective layer 106 and the two-dimensional semiconductor layer 104 involves forming a patterned photoresist (PR) on the protective layer 106 using one or more photolithography processes. The unprotected portions of the protective layer 106 and the two-dimensional semiconductor layer 104 are subsequently removed using a dry etching technique, such as inductively coupled plasma (ICP), remote plasma, capacitor-coupled plasma (CCP), atomic layer etching (ALE), or a wet etching technique, such as buffer oxide etchant (BOE), phosphoric acid ($H_3PO_4$), sodium hydroxide (NaOH), or potassium hydroxide (KOH).

In particular, the composition of dry etching plasma gas includes a combination of water vapor ($H_2O$), oxygen ($O_2$), boron chloride ($BCl_3$), chlorine ($Cl_2$), argon (Ar), nitrogen fluoride ($NF_3$), hydrogen bromide (HBr), sulfur fluoride ($SF_6$), $CH_2F_2$, and $CH_4$.

Figure 1E:
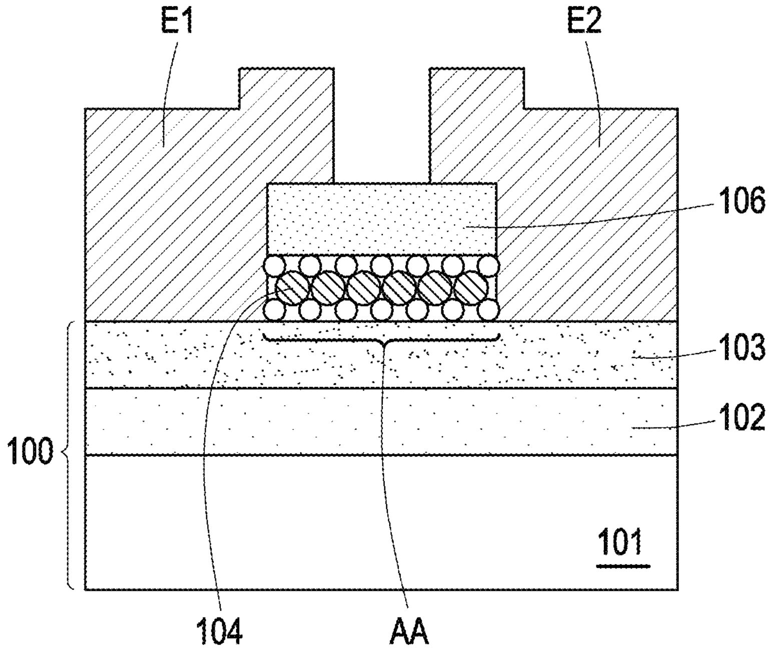

In FIG. 1E, a patterned photoresist is removed, and the electrodes E1 and E2 are deposited on the protective layer 106 and substrate 100. Formation of the first electrode E1 and the second electrode E2 includes depositing a single layer or several layers of a metal film using chemical or physical vapor deposition, and removing a portion of the metal film via etching. The structure of the first electrode E1 and the second electrode E2 may be a combination of TiN/Ti/TiN, Ta/TiN, TiAlC, WN, Ni, Ti, tungsten, molybdenum, cobalt, etc. or a single-layer or multi-layer structure thereof. It should be noted that the invention is not limited to these materials or combinations.

The protective layer shields the two-dimensional semiconductor layer 104 from damage during process, allowing flexibility in materials and the deposition option of the first electrode E1 and the second electrode E2.

In an embodiment, the first electrode E1 may be used as the source of the semiconductor device, the second electrode E2 may be used as the drain of the semiconductor device, and the two-dimensional semiconductor layer 104 may be used as a channel of the semiconductor device.

Figure 1F:
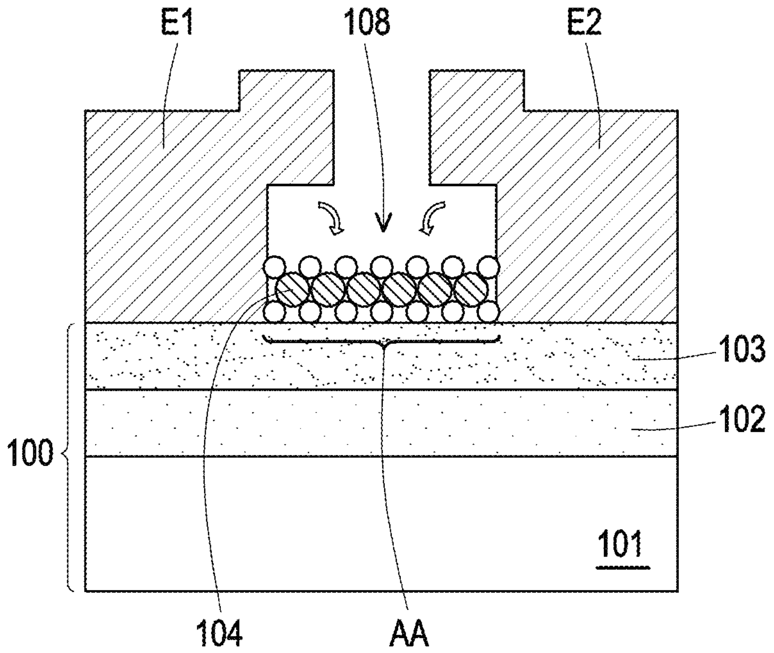

In FIG. 1F, the protective layer 106 in FIG. 1E is completely removed, so that the first electrode E1 and the second electrode E2 are collapsed onto the surface of the two-dimensional semiconductor layer 104, forming a van der Waals gap 108 between the first electrode E1 and the two-dimensional semiconductor layer 104 and between the second electrode E2 and the two-dimensional semiconductor layer 104.

Figure 1G:
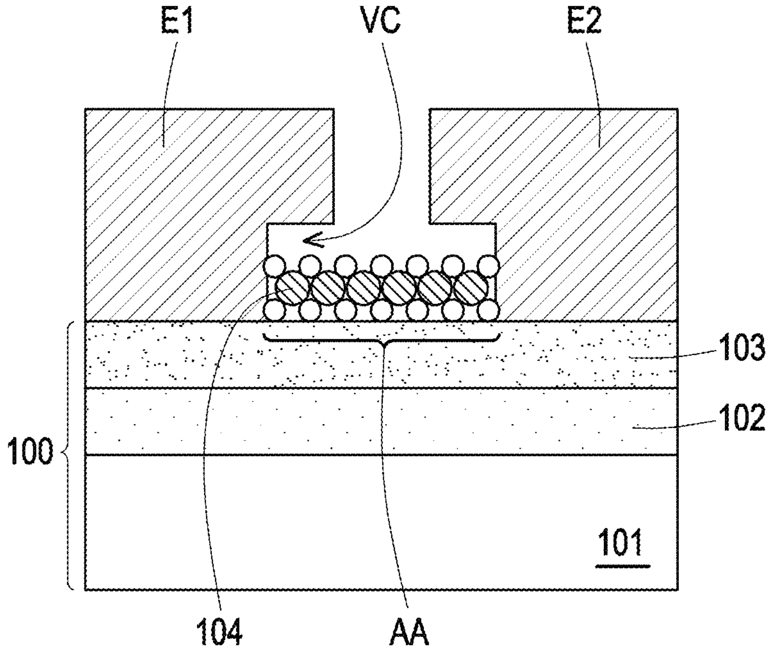

In FIG. 1G, the collapsed first electrode E1 and second electrode E2 form a van der Waals contact structure (VC) between the first electrode E1 and the two-dimensional semiconductor layer 104 and between the second electrode E2 and the two-dimensional semiconductor layer 104.

Several experimental examples are listed below to verify the implementation of the invention, but the invention is not limited to the following contents.

<Experimental Example> Fabrication of Two-Dimensional Semiconductor Device

First, a silicon oxide layer and a hafnium oxide ($HfO_2$) layer were formed on a silicon wafer. Then, a molybdenum disulfide film was deposited, and an aluminum oxide layer was deposited on the surface of the molybdenum disulfide film using an electron gun (E-Gun) evaporation. Then, a photolithography process was performed using an Canon FPA-6300es6a scanner, and a portion of the aluminum oxide layer and the molybdenum disulfide film was removed using a BOE solution to define the active area of the device. The remaining molybdenum disulfide film was used as a channel of the transistor, with a channel length of approximately 200 nm and a channel width of approximately 1 μm. Then, metal films were formed via sputtering, wherein the metal films were titanium nitride/titanium/titanium nitride (TiN/Ti/TiN) using ULVAC ENTRON W200. Then, a first electrode and a second electrode were defined using a Lam Research 2300 etcher. Lastly, the aluminum oxide layer was removed completely using the BOE solution, so that the first electrode E1 and the second electrode E2 were collapsed onto the surface of the molybdenum disulfide film to complete the fabrication of the transistor device.

Figure 2:
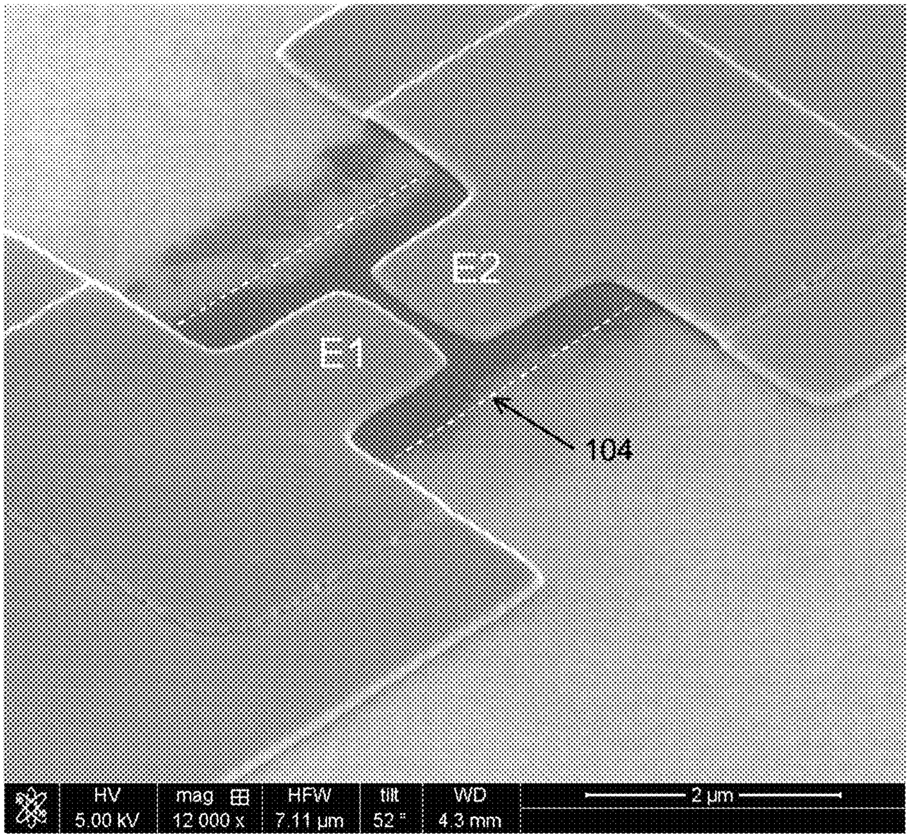
FIG. 2 is an SEM image of a two-dimensional semiconductor device of an experimental example.

FIG. 2 is a scanning electronic microscopy (SEM) image of a two-dimensional semiconductor device of an experimental example, wherein the positional relationship between the first electrode E1, the second electrode E2, and the two-dimensional semiconductor layer 104 (molybdenum disulfide film) is shown.

<Electrical Analysis 1>

Figure 3A:
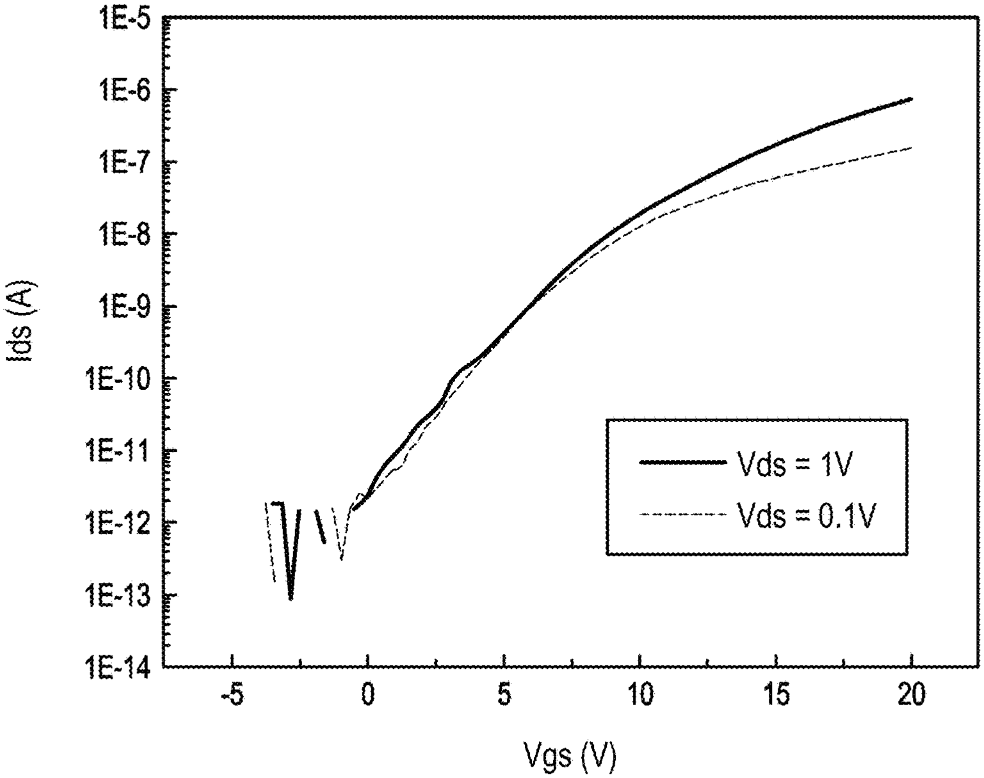
FIG. 3A is an Id-Vg curve of a two-dimensional semiconductor device of an experimental example.
Figure 3B:
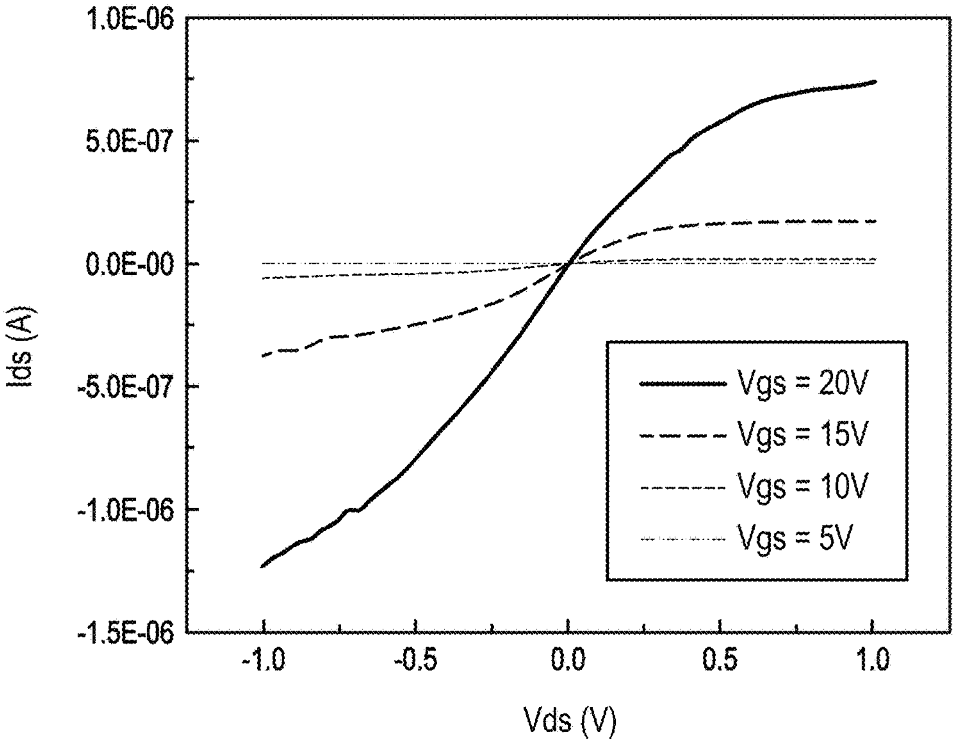
FIG. 3B is an Id-Vd curve of a two-dimensional semiconductor device of an experimental example.

FIG. 3A and FIG. 3B depict electrical characteristics of the experimental device, showing transfer and output characteristics which is the electrical characteristics of a transistor. In addition, the IV curve in FIG. 3B for which Vgs is 0 V is not drawn specifically since the transistor is in the off state and Ids is fixed at 0.

<Electrical Analysis 2>

According to the method of the experimental example, 218 independent two-dimensional semiconductor devices were fabricated in a single die on an eight-inch wafer.

In order to ensure that the standards for determining device characteristics were consistent every time and to reduce determination errors caused by measurement as much as possible, the inventors established a SPICE (Simulation Program with Integrated Circuits Emphasis) model for two-dimensional semiconductor materials, which was used to systematically, quickly, and effectively extract transistor parameters.

First, transition metal sulfides are inherently easy to desorb on the material surface due to chalcogen elements, forming vacancies (chalcogen vacancy). The resulting defect energy state density (gap state) may be observed from the band relationship. Since the position thereof is close to the lowest point of the conduction band (conduction band minimum, CBM), this material is similar to an n-type semiconductor having a certain doping concentration. The two-dimensional semiconductor material transistor made on this basis is operated in a depletion mode, and the carriers become an n-type accumulation model with the change in the surface band bending.

In equation (2.182) in the reference document (Fundamentals of Modern VLSI Devices (2nd ed.) published in 2009, author/editor Yuan Taur & Tak H. Ning, Cambridge: Cambridge University Press), it may be deduced through the principle of electrical neutrality and Poisson's equation that the charge density (Qs) and the surface band bending (ψS) of n-type semiconductor materials have the following relationship:

$$Q_S = \pm\sqrt{2\varepsilon_S kTN_d}\left[\left(e^{\frac{q\psi_S}{kT}} - \frac{q\psi_S}{kT} - 1\right) + \frac{n_i^2}{N_d^2}\left(e^{\frac{-q\psi_S}{kT}} + \frac{q\psi_S}{kT} - 1\right)\right]^{1/2} \quad (1)$$

Referring to the equation (2.202) in the above literature, it may be derived that the ideal gate electric field is across the dielectric layer material and the semiconductor material respectively, and is described by the following equation:

$$V_g = \frac{qN_d t_{ox}}{\varepsilon_S\varepsilon_0}\sqrt{\frac{2\varepsilon_S\varepsilon_0}{qN_d}}\sqrt{\psi_S} + \psi_S = A\sqrt{\psi_S} + \psi_S \quad (2)$$

wherein the dielectric layer cross-voltage is the first mathematical relationship that may be expressed by the degree of semiconductor surface band bending, and the fixed parameter value of the basic material parameter is represented by A to obtain a simplified mathematical relationship.

This simplified mathematical relationship is a quadratic equation of one variable, wherein $\psi_S$ may be converted into the following relationship:

$$\psi_S = \frac{A^2 \pm \sqrt{A^4 + 4A^2 V_g} + 2V_g}{2} \quad (3)$$

At this time, this relationship is brought into equation (1), and the material charge density may be expressed by applying a bias voltage to the gate. Since the two-dimensional material is an n-type accumulation model and the current size is proportional to the surface charge density and most of the parameter terms are simplified and the translation correction term is taken into account, equation (1) may be simplified into the following relationship:

$$Q_S = A' e^{\left(B\left(C\sqrt{V_g}\right)+2V_g\right)} + D \quad (4)$$

The transistor current is proportional to Qs, so A' may be replaced with another parameter to obtain the actual current.

After the basic transistor model is established, data fitting may be started. There are four parameter items in equation (4) that may be used for curve adjustment. The process continuously iterates the values of the four parameters and measures the errors with the experimental values. Lastly, a fitting curve with the smallest error (local minimum) from the experimental values is obtained. Then, the device parameters are extracted based on this fitting curve to obtain five basic parameters of transistors such as transistor current on/off ratio, threshold voltage (Vth), subthreshold swing (S.S), Ion (maximum current density), and carrier mobility (μeff).

The following are the steps of the analysis program written by the inventors using MATLAB mathematics software:

Step 1. Data was collected and classified (position, device size . . . )

Step 2. The current on/off ratio was determined using a Sigmoid Function (S-shaped function) fitting curve.

Step 3. A current on/off ratio of the device less than 102 (A/A) was determined as failure.

Step 4. Ioff data was discarded.

Figure 4A:
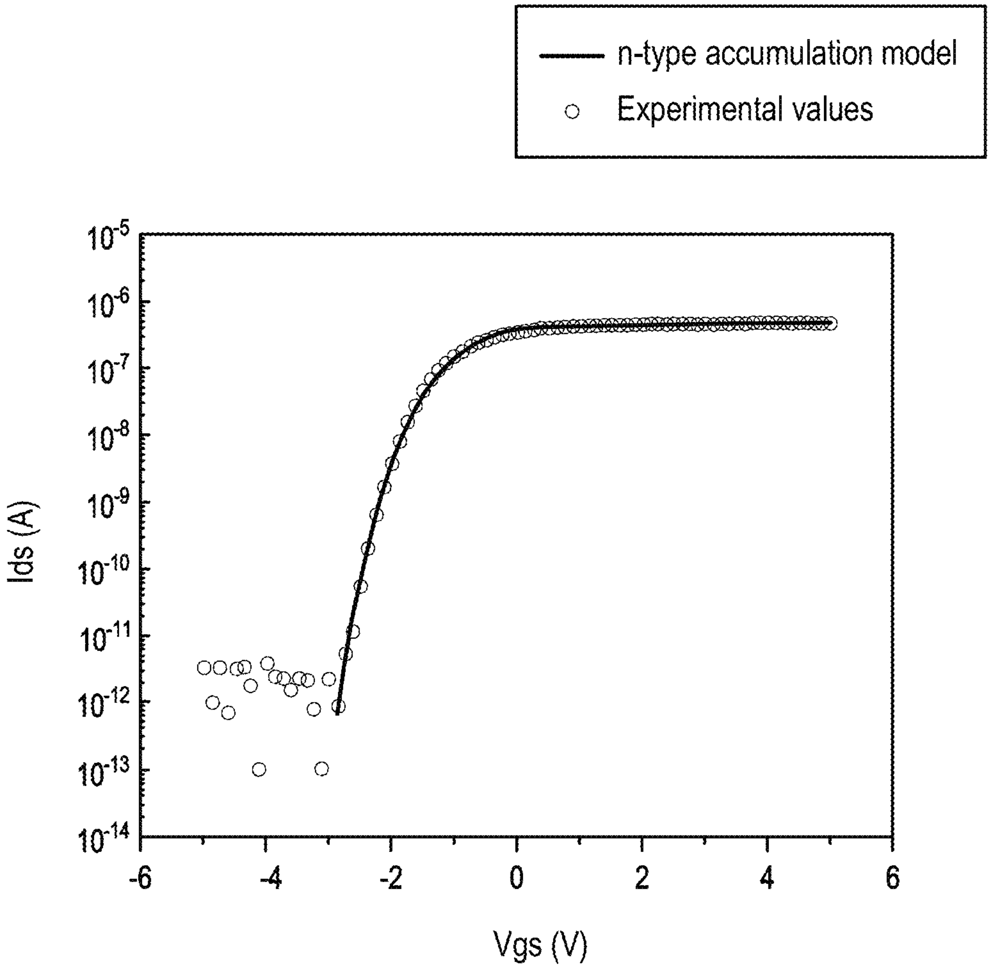
FIG. 4A to FIG. 4B are electrical analysis diagrams of an experimental 2D semiconductor device of an experimental example using <Electrical analysis 2> method.

Step 5. The curve was fitted using a two-dimensional material SPICE model and an n-type accumulation model was obtained, such as the curve of FIG. 4A.

Figure 4B:
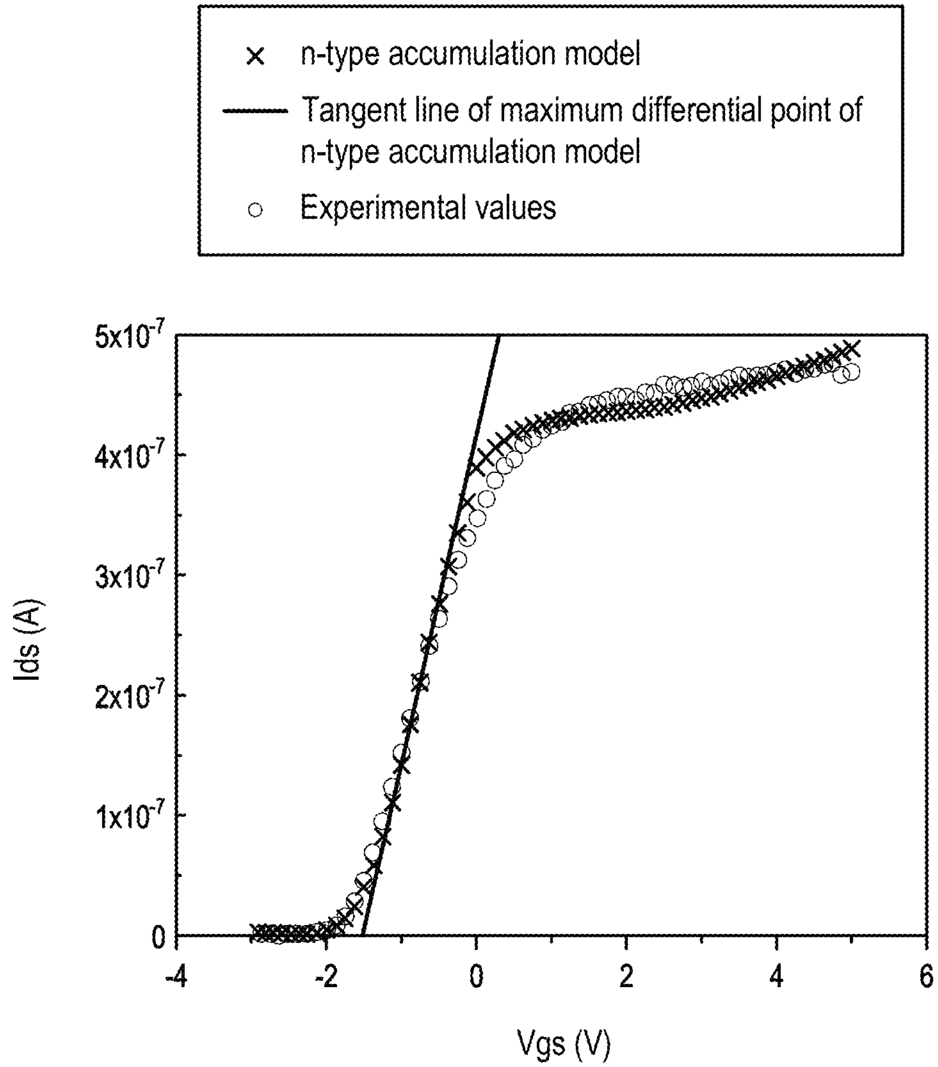

Step 6. The curve of FIG. 4A was exponentially converted into a linear relationship to obtain a line segment as shown in FIG. 4B, wherein the point where the tangent line is intersected with the X-axis is the Vth value.

Step 7. The linear relationship data was differentiated to obtain gm (transduction) and μeff values.

Step 8. The maximum current density was calculated according to different device design sizes.

Step 9. The data was classified and summarized (characteristic and positional relationship diagram, normal distribution diagram, data classification quantity diagram, transistor output current diagram, transistor transfer curve diagram).

FIG. 5A to FIG. 5E are bar charts of current on/off ratio, threshold voltage, subthreshold swing. Ion, and mobility obtained according to the above method.

Figure 5A:
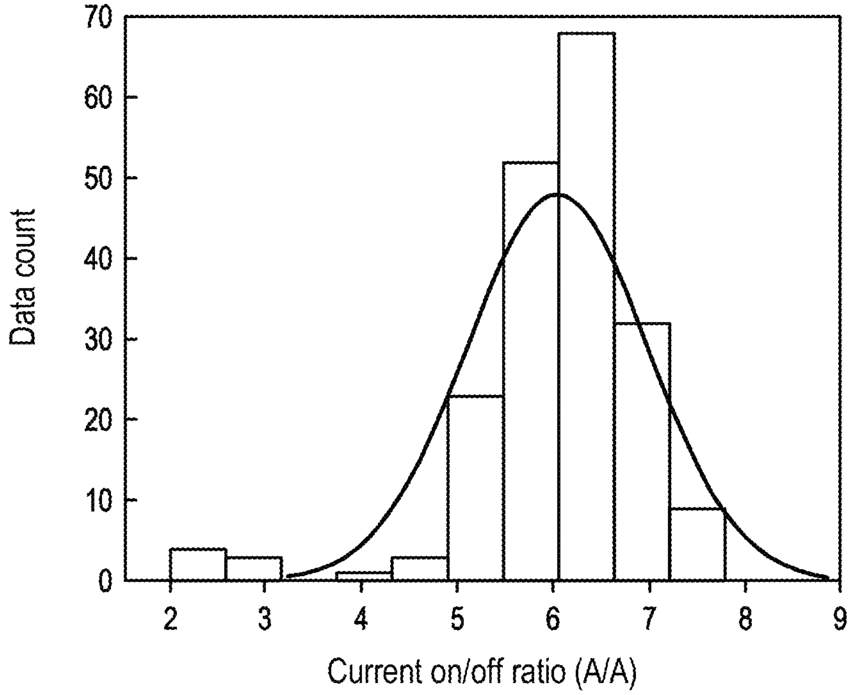
FIG. 5A is a bar chart of the ON/OFF current ratio ($I_{onoff}$ ratio) of a two-dimensional semiconductor device of an experimental example.

It may be seen from FIG. 5A that most two-dimensional semiconductor devices have a current on/off ratio exceeding the five order (the numbers of the horizontal axis of FIG. 5A represent powers of 10). Moreover, after further statistics, it is found that about 83% of the two-dimensional semiconductor devices have a current on/off ratio exceeding the fifth power, and 95% of the two-dimensional semiconductor devices have a current on/off ratio exceeding the four order. This result represents a yield rate of 83% or more.

Figure 5B:
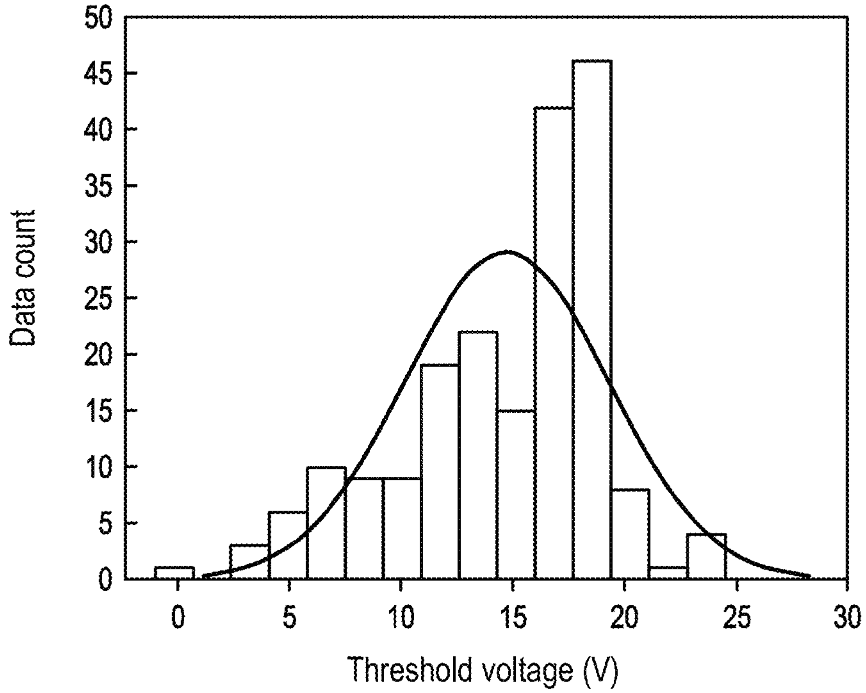
FIG. 5B is a bar chart of the threshold voltage of a two-dimensional semiconductor device of an experimental example.

It may be seen from FIG. 5B that the statistically obtained threshold voltage is about 15 V.

Figure 5C:
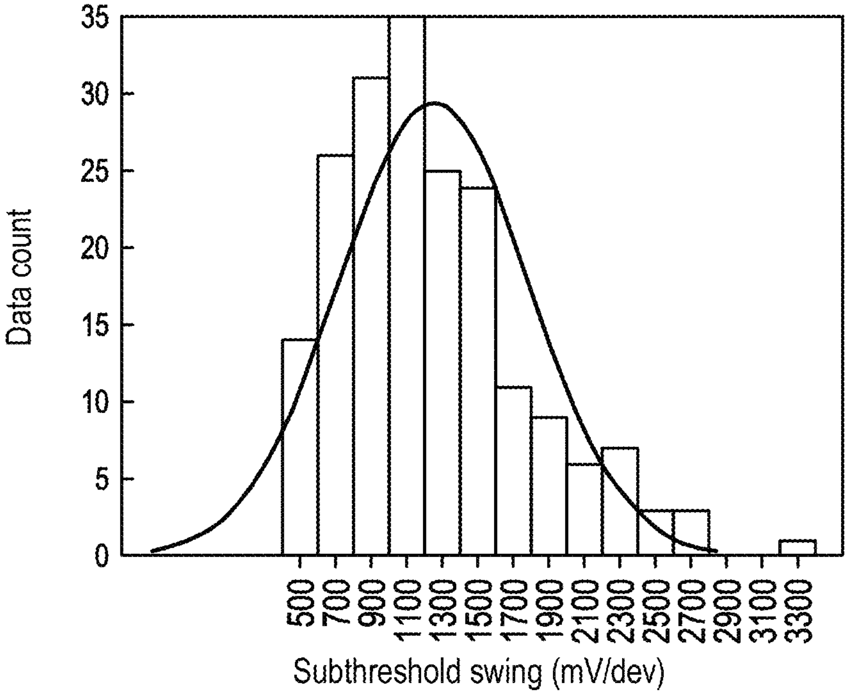
FIG. 5C is a bar chart of the subthreshold swing of a two-dimensional semiconductor device of an experimental example.

It may be seen from FIG. 5C that the statistically obtained subthreshold swing is about 900 mV/dev.

Figure 5D:
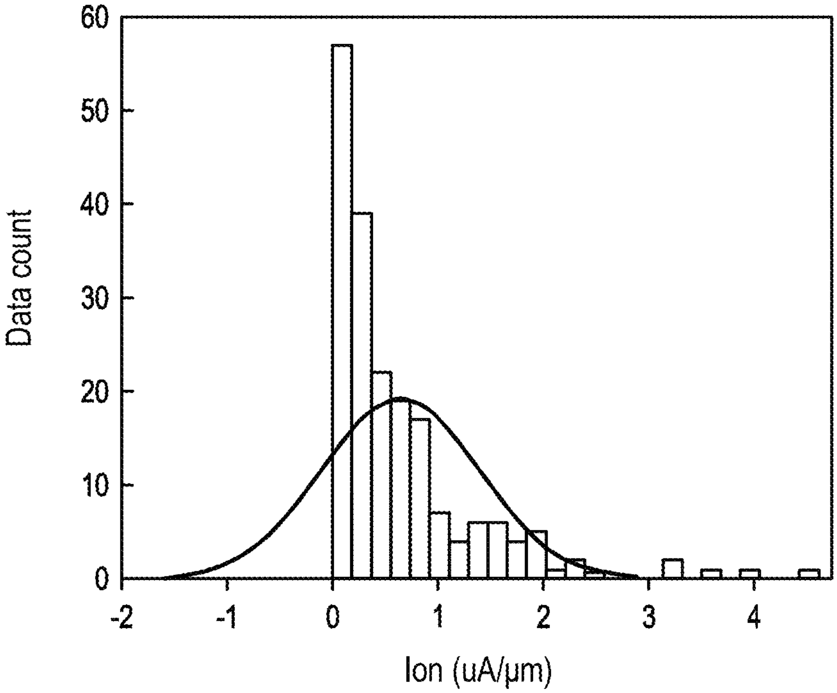
FIG. 5D is an Ion bar chart of a two-dimensional semiconductor device of an experimental example.

It may be seen from FIG. 5D that the statistically obtained Ion is about 0.8 μA/μm.

Figure 5E:
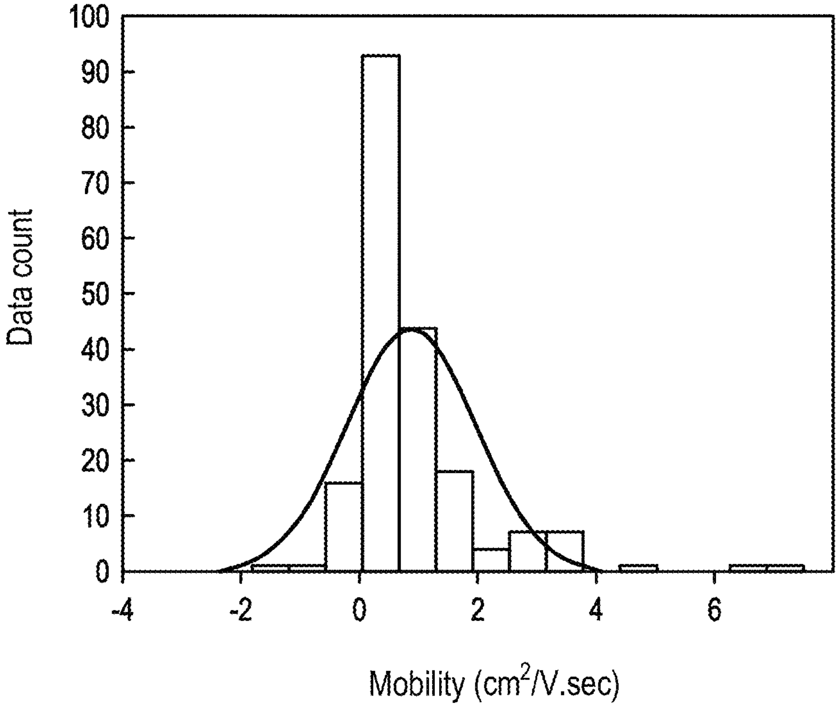
FIG. 5E is a mobility bar chart of a two-dimensional semiconductor device of an experimental example.

It may be seen from FIG. 5E that the statistically obtained mobility is about 1 $cm^2$/V-sec.

The values obtained by the above statistics are all consistent with the electrical characteristics of the transistor and have excellent yield.

<Physical Analysis>

Figure 6A:
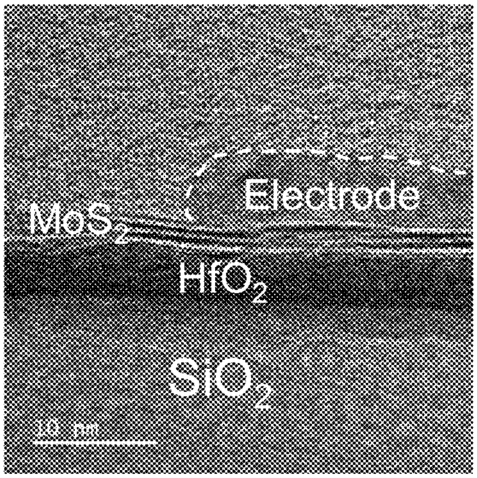
FIG. 6A is an TEM image of a two-dimensional semiconductor device of an experimental example.
Figure 6B:
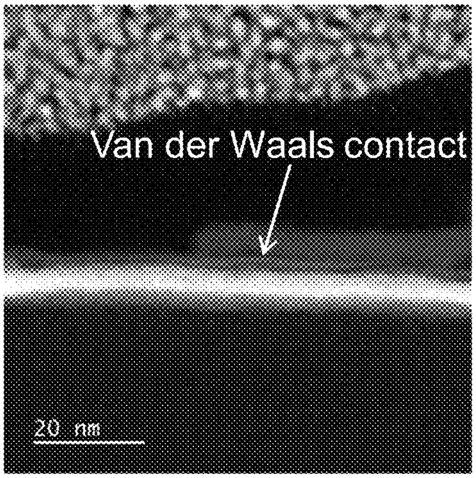
FIG. 6B is an HR-TEM image (dark field) of FIG. 6A.

FIG. 6A is a transmission electron microscopy (TEM) image of a two-dimensional semiconductor device of an experimental example. FIG. 6B is a high-resolution transmission electron microscopy (HR-TEM) image (dark field) of FIG. 6A.

Figure 7A:
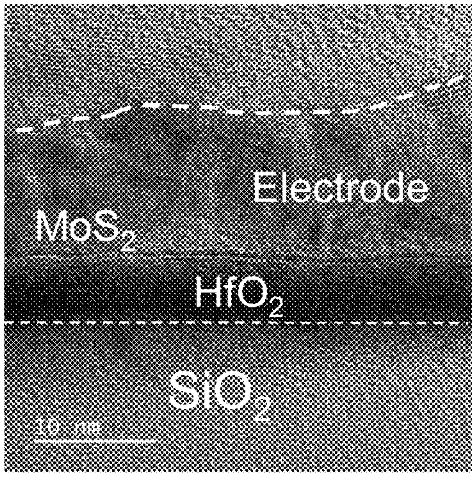
FIG. 7A is another TEM image of a two-dimensional semiconductor device of an experimental example.
Figure 7B:
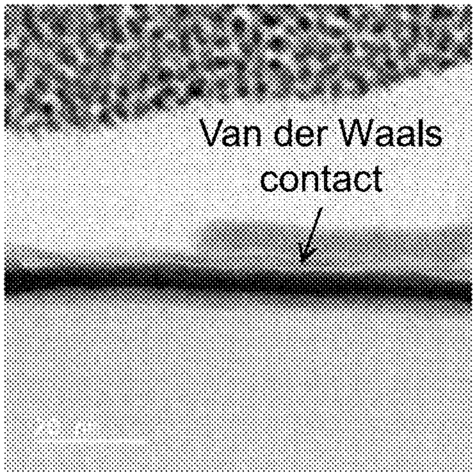
FIG. 7B is an HR-TEM image (bright field) of FIG. 7A.

FIG. 7A is another TEM image of a two-dimensional semiconductor device of an experimental example. FIG. 7B is an HR-TEM image (bright field) of FIG. 7A.

It may be seen from the TEM images of FIG. 6A and FIG. 7A that the two-dimensional semiconductor layer ($MoS_2$) is still intact after the entire process and shows good contact with the metal film (electrode). It may be further observed from the HR-TEM images of FIG. 6B and FIG. 7B that the metal-semiconductor junction (the interface between $MoS_2$ and the electrode) has a very narrow gap, indicating a van der Waals contact structure, which is expected to effectively improve the performance of the two-dimensional semiconductor layer.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of a semiconductor device, comprising the following steps:

forming a two-dimensional semiconductor layer on a substrate;

depositing a protective layer on the two-dimensional semiconductor layer;

patterning the protective layer and the two-dimensional semiconductor layer;

forming a first electrode and a second electrode on a portion of the protective layer and the substrate; and removing the protective layer completely to form a van der Waals contact structure between the first electrode and the two-dimensional semiconductor layer and between the second electrode and the two-dimensional semiconductor layer.

2. The manufacturing method of claim 1, wherein a method of forming the van der Waals contact structure comprises:

removing the protective layer using an isotropic etching method or an anisotropic etching method; and collapsing the first electrode and the second electrode onto the two-dimensional semiconductor layer.

3. The manufacturing method of claim 1, wherein a method of patterning the protective layer and the two-dimensional semiconductor layer comprises:

forming a patterned mask on the protective layer using a photolithography process; and removing the protective layer and the two-dimensional semiconductor layer not blocked by the patterned mask via etching.

4. The manufacturing method of claim 1, wherein a method of forming the first electrode and the second electrode comprises:

depositing a metal film on the protective layer; and removing a portion of the metal film via dry etching or wet etching.

5. The manufacturing method of claim 4, wherein the metal film comprises a single layer or several layers of a metal film formed by chemical vapor deposition or physical vapor deposition.

6. The manufacturing method of claim 1, wherein a method of removing the protective layer completely comprises isotropic etching or anisotropic etching.

7. The manufacturing method of claim 1, wherein the protective layer comprises an oxide or nitride dielectric material.

8. The manufacturing method of claim 1, wherein a method of depositing the protective layer comprises using a physical vapor deposition method or a chemical vapor deposition method.

9. The manufacturing method of claim 1, wherein a material of the two-dimensional semiconductor layer comprises a tungsten disulfide ($WS_2$), molybdenum disulfide ($MoS_2$), tungsten diselenide ($WSe_2$), molybdenum ditelluride ($MoTe_2$), tungsten ditelluride ($WTe_2$), or molybdenum diselenide ($MoSe_2$) layered structure material.

10. The manufacturing method of claim 1, wherein a method of forming the two-dimensional semiconductor layer on the substrate comprises: physical vapor deposition, chemical vapor deposition, or a transfer method.

* * * * *